(12) United States Patent
Ito et al.

(10) Patent No.: US 10,244,670 B2
(45) Date of Patent: Mar. 26, 2019

(54) ELECTRONIC COMPONENT, ELECTRIC COMPONENT MANUFACTURING APPARATUS, AND ELECTRONIC COMPONENT MANUFACTURING METHOD

(71) Applicant: SHIBAURA MECHATRONICS CORPORATION, Yokohama-shi, Kanagawa (JP)

(72) Inventors: Akihiko Ito, Yokohama (JP); Yoshinao Kamo, Yokohama (JP); Shigeki Matsunaka, Yokohama (JP); Atsushi Fujita, Yokohama (JP)

(73) Assignee: SHIBAURA MECHATRONICS CORPORATION, Yokohama-Shi, Kanagawa (JP)

( * ) Notice: Subject to any disclaimer, the term of this patent is extended or adjusted under 35 U.S.C. 154(b) by 0 days.

(21) Appl. No.: 15/730,361

(22) Filed: Oct. 11, 2017

(65) Prior Publication Data
US 2018/0110162 A1 Apr. 19, 2018

(30) Foreign Application Priority Data

Oct. 13, 2016 (JP) .................................. 2016-201521

(51) Int. Cl.
*H05K 9/00* (2006.01)
*H01L 21/56* (2006.01)
(Continued)

(52) U.S. Cl.
CPC ......... *H05K 9/0084* (2013.01); *H01L 21/561* (2013.01); *H01L 21/67092* (2013.01);
(Continued)

(58) Field of Classification Search
CPC .... H05K 9/0084; H01L 23/552; H01L 21/561
See application file for complete search history.

(56) References Cited

U.S. PATENT DOCUMENTS

| 7,906,371 B2 * | 3/2011 | Kim ...................... H01L 21/561 438/106 |
| 9,466,545 B1 * | 10/2016 | Scanlan ............... H05K 1/0216 |

(Continued)

FOREIGN PATENT DOCUMENTS

| CN | 1639381 A | 7/2005 |
| JP | 2015109301 A | 6/2015 |

(Continued)

*Primary Examiner* — Hung V Ngo
(74) *Attorney, Agent, or Firm* — Nath, Goldberg & Meyer; Jerald L. Meyer; Joshua B. Goldberg

(57) ABSTRACT

An electronic component, an electronic component manufacturing apparatus, and an electronic component manufacturing method are provided which enable an electromagnetic wave shielding film formed on a package to achieve an excellent shielding characteristic. An electronic component 10 includes an electromagnetic wave shielding film 13 formed on the top face of a package sealing elements. The thickness of the electromagnetic wave shielding film 13 on the top face of the package 12 is 0.5 to 9 μm, and the relationship between the average height Rc of the roughness curvature factor of the top face of the package 12 and the thickness Te of the electromagnetic wave shielding film 13 is Rc≤2Te.

3 Claims, 17 Drawing Sheets

(51) Int. Cl.
*H01L 21/67* (2006.01)
*H01L 23/552* (2006.01)
*H01L 21/683* (2006.01)
*H01L 21/687* (2006.01)

(52) U.S. Cl.
CPC .... *H01L 21/6835* (2013.01); *H01L 21/68764* (2013.01); *H01L 21/68771* (2013.01); *H01L 23/552* (2013.01); *H05K 9/0024* (2013.01); *H01L 21/565* (2013.01)

(56) References Cited

U.S. PATENT DOCUMENTS

| | | | | |
|---|---|---|---|---|
| 2004/0038510 | A1* | 2/2004 | Munakata | H01L 21/561 438/613 |
| 2011/0127654 | A1 | 6/2011 | Weng et al. | |
| 2012/0133032 | A1* | 5/2012 | Tsai | H01L 23/552 257/659 |
| 2015/0296667 | A1* | 10/2015 | Hirose | H01L 21/568 427/126.2 |
| 2016/0035680 | A1* | 2/2016 | Wu | H01L 23/552 257/659 |
| 2016/0225733 | A1* | 8/2016 | Wilcoxen | H01L 24/14 |
| 2016/0227680 | A1* | 8/2016 | Hyun | H05K 9/0024 |
| 2016/0268216 | A1* | 9/2016 | Kim | H01L 23/552 |
| 2017/0347462 | A1* | 11/2017 | Miwa | H01L 24/97 |

FOREIGN PATENT DOCUMENTS

| | | |
|---|---|---|
| KR | 1020070011397 A | 1/2007 |
| KR | 1020110134168 A | 12/2011 |
| KR | 1020160001853 A | 1/2016 |
| TW | 201601280 A | 1/2016 |
| TW | 201619448 A | 6/2016 |
| WO | 2013/035819 A1 | 3/2013 |

* cited by examiner

ELECTRONIC COMPONENT, ELECTRIC COMPONENT MANUFACTURING APPARATUS, AND ELECTRONIC COMPONENT MANUFACTURING METHOD

CROSS-REFERENCE TO RELATED APPLICATION

This application is based upon and claims the benefit of priority from Japan Patent Application No. 2016-201521, filed on Oct. 13, 2016, the entire contents of which are incorporated herein by reference.

FIELD OF THE INVENTION

The present disclosure relates to an electronic component, an electronic component manufacturing apparatus, and an electronic component manufacturing method.

BACKGROUND

A large number of semiconductor devices that are electronic components are built in a wireless communication apparatus represented by a mobile phone. Semiconductor devices are required to suppress an adverse effect of electromagnetic waves to an interior and an exterior like a leakage of electromagnetic waves in order to prevent an adverse effect to communication characteristics. Hence, semiconductor devices which have a shielding function against the electromagnetic waves have been applied.

In general, a semiconductor device is formed by mounting a semiconductor chip on an interposer substrate that is an intermediate substrate to amounting substrate, and by sealing this semiconductor chip by a resin. By providing a conductive electromagnetic wave shielding film on the top face and the side face of this sealing resin, the semiconductor devices achieving the shielding function have been provided (see WO 2013/035819 A).

Such an electromagnetic wave shielding film can be a laminate film of multiple kinds of metals. For example, an electromagnetic wave shielding film is known which employs a laminated structure of forming a Cu film on an SUS film, and further forming an SUS film thereon.

In order to accomplish a sufficient shielding effect for an electromagnetic wave shielding film, it is necessary to decrease the electric resistivity. Hence, the electromagnetic wave shielding film needs to have a thickness to some level.

In semiconductor devices, in general, when a film has a thickness of substantially 1 to 10 μm, an excellent shielding characteristic is expectable. In the case of the above electromagnetic wave shielding film employing the laminated structure of SUS, Cu, and SUS, it is known that, when the thickness is substantially 1 to 5 μm, an excellent shielding effect is expectable.

As a forming method for the electromagnetic wave shielding film, plating method is known. However, since the plating method needs wet processes such as a pre-process step, a plating process step, and a post-process step like wet-cleaning, those result in the increase of the manufacturing cost for a semiconductor device.

Accordingly, sputtering method that is a dry process is getting attention. A plasma processing apparatus that forms a film by plasma has been proposed as a film forming apparatus by sputtering method. The plasma processing apparatus introduces an inactive gas into a vacuum chamber in which a target is placed, and applies a DC voltage. The ions of the plasma inactive gas are caused to be collided with the target of the film formation material, and a film is formed by depositing the material beaten out from the target on a work-piece.

General plasma processing apparatuses are applied for a film formation with a thickness of 10 to several 100 nm that can be formed by a process time of several ten seconds to several minutes. However, as described above, it is necessary to form a film with a thickness in a micron order as the electromagnetic wave shielding film. Since sputtering is a technology of forming a film by depositing particles of the film formation material on an object on which the film is formed, the thicker film thickness lengthens the time required to form a film.

Hence, in order to form the electromagnetic wave shielding film, a processing time of substantially several ten minutes to an hour is necessary which is longer than general sputtering. In the case of, for example, the electromagnetic wave shielding film employing the laminated structure of SUS, Cu, and SUS, a process time of around an hour is necessary in some cases to obtain a thickness of 5 μm.

In this case, according to sputtering method by plasma, a package that is an exterior component of a semiconductor device is continuously exposed to the plasma heat during the process time. Consequently, the package may be heated to a temperature around 200° C. until a film with a thickness of 5 μm is obtained.

In contrast, the heat resistant temperature of the package is substantially 200° C. in the case of a temporal heating of substantially several seconds to several ten seconds, but when the heating time exceeds several minutes, the heat resistant temperature is generally around 150° C. Hence, it is difficult to form the electromagnetic wave shielding film in a micron order by general plasma sputtering method.

In order to address this problem, use of a film material that is magnetic substances, such as Ni and Fe can be considered. Since the magnetic substances have a high shielding effect and can be in a relatively thin film, the heating time by sputtering can be reduced, the temperature rise can be avoided, and the tact time can be reduced. However, when the electromagnetic wave shielding film formed of the magnetic substance is formed on the semiconductor package in practice by sputtering, a desired shielding characteristic to the electromagnetic wave cannot be obtained in some cases.

In addition, the plasma processing apparatus may be provided with cooling means for suppressing the temperature rise of the semiconductor package. In this case, although the apparatus structure becomes complicated and increased, a heating when the electromagnetic wave shielding film including Cu is formed can be reduced. However, for the electromagnetic wave shielding film that is not a magnetic substance, a desired shielding characteristic cannot be obtained in some cases.

An objective of the present disclosure is to provide an electronic component, an electronic component manufacturing apparatus, and an electronic component manufacturing method enabling an electromagnetic wave shielding film formed on a package to achieve an excellent shielding characteristic.

SUMMARY OF THE INVENTION

In order to accomplish the above objective, an electronic component according to the present disclosure includes:

an electromagnetic wave shielding film formed on a top face of a package sealing an element, in which:

a thickness Te of the electromagnetic wave shielding film on the top face of the package is 0.5 to 9 μm; and a relationship between an average height Rc of a roughness curvature factor of the top face of the package and the thickness Te of the electromagnetic wave shielding film is Rc≤2Te.

The average height Rc of the roughness curvature factor of the top face of the package may be equal to or smaller than 5 μm.

A manufacturing apparatus of the electronic component according to the present disclosure includes:

a polishing apparatus polishing a top face of a sealing body having a plurality of elements sealed by a sealing material;

a dividing apparatus dividing the sealing body into the individual electronic component having each element sealed by a package of the encapsulation material by dicing the sealing body; and a film forming apparatus forming the electromagnetic wave shielding film on an external surface of the package of the individual electronic component by sputtering.

The film forming apparatus may include:

a chamber that is a container in which a sputtering gas is introduced;

a carrying unit which is installed in the chamber and which circulates and carries the electronic component on a circular trajectory; and a plurality of film formation processing units each including a sputter source that deposits a film formation material on the electronic component which is being circulated and carried by the carrying unit to form a film by sputtering, and also including a separating unit that separates a film formation position where the sputter source forms the film on the electronic component.

The plurality of film formation processing units includes the respective sputter sources corresponding to different kinds of film formation materials, and form a film comprising layers of the plural kinds of film formation materials by selectively depositing the single kind of the film formation material one by one.

A manufacturing method of the electronic component according to the present disclosure includes:

polishing the top face of the package by a polishing apparatus; and forming the electromagnetic wave shielding film on the package by sputtering and by a film forming apparatus.

A manufacturing method of the electronic component according to the present disclosure includes:

polishing a top face of a sealing body having a plurality of elements sealed by a sealing material;

dividing the sealing body into the individual electronic component having each element sealed by a package of the sealing material by dicing the sealing body; and forming the electromagnetic wave shielding film on an external surface of the package of the individual electronic component by sputtering.

DETAILED DESCRIPTION OF THE EMBODIMENTS

An embodiment of the present disclosure (hereafter, referred to as this embodiment) will be described in detail with reference to figures.

[Electronic Component]

Figure 1:
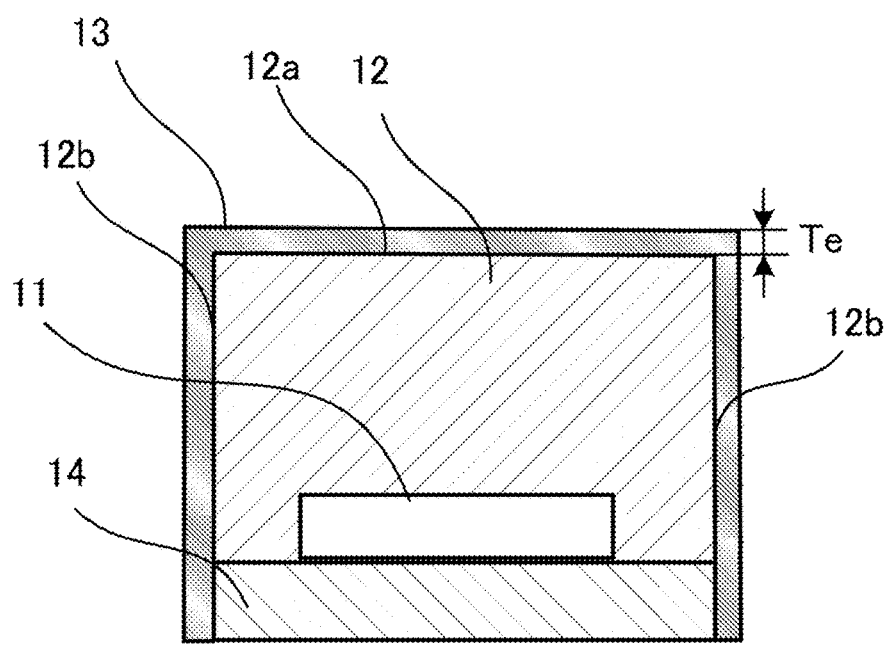
FIG. 1 is an exemplarily cross-sectional view illustrating an electronic component according to an embodiment.

As illustrated in FIG. 1, an electronic component 10 according to this embodiment has an electromagnetic wave shielding film 13 formed on a top face 12a and a side face 12b of a package 12 that seals an element 11. In order to obtain a shielding effect, the electromagnetic wave shielding film 13 is formed on at least the top face 12a of the package 12. The electromagnetic wave shielding film 13 on the side face 12b is for grounding. The top face 12a of the package 12 is an outermost surface opposite to a surface to be mounted on a product. When the electronic component 10 is placed horizontally, the top face 12a becomes the upper surface at the highest position, but may be directed upwardly or not directed upwardly when the electronic component 10 is mounted. The side face 12b is an outer circumference formed at a different angle relative to the top face 12a. A corner may be formed between the top face 12a and the side face 12b, or a curved surface may be formed. The element 11 is a surface mounting component, such as a semiconductor chip, a diode, a transistor, a capacitor, and an SAW filter. In the following explanation, a semiconductor chip is applied as an example of the element 11. The semiconductor chip in this case is configured as an integrated circuit which integrates multiple electronic elements. In order to facilitate understanding to a manufacturing apparatus and a manufacturing process, a component before the electromagnetic wave shielding film 13 is formed will be referred to as the electronic component 10 in some cases.

The element 11 is mounted on the surface of a substrate 14. In the substrate 14, a circuit pattern is formed on the surface of a plate formed of ceramics, glass, an epoxy resin, etc. The element 11 and the circuit pattern are connected by soldering.

The package 12 is configured by sealing the surface of the substrate 14 on which the elements 11 are mounted by a synthetic resin so as to cover the elements 11. The package is formed in a substantially cuboid shape. The electromagnetic wave shielding film 13 is a film that shields the electromagnetic waves produced by conductive materials.

A thickness Te of the electromagnetic wave shielding film 13 is 0.5 to 9 μm. More preferably, the thickness Te is 0.5 to 3 μm. As for the top face 12a of the package 12, the relationship between an average height Rc of the roughness curvature factor and thickness Te of the electromagnetic wave shielding film 13 is Rc<=2Te. More preferably, Rc is equal to or smaller than 5 μm. In this case, Rc is an average height of the contour curvature factor that is a height between a set of adjacent hill and valley within a reference length (JIS B 0601-2001, ISO 4287-1997). The reference length can be obtained by a method in which the reference length is evaluated by procedures based on JIS B 0633-2001 (ISO4288-1996) using a stylus-type surface roughness tester compliant with JIS B 0651-2001 (ISO 3274-1996).

(Reason that a Film of Magnetic Substance Cannot Obtain a Shielding Characteristic)

Since magnetic substances have a high electromagnetic wave shielding performance, it is considered that the magnetic substances are suitable as the electromagnetic wave shielding film formed on the package of the electronic component. Hence, according to a simulation based on the original performance of a magnetic substance, a high shielding characteristic can be obtained. For example, an excellent shielding performance to electromagnetic waves within the band of 600 MHz to 1 GHz can be accomplished. In practice, however, when an electromagnetic wave shielding film formed of a magnetic substance is formed on the package of the electronic component having the semiconductor chip as the element, the shielding characteristic like the simulation was not obtained.

The inventor keenly examined a reason that the shielding characteristic cannot be obtained, and newly discovered the following reason. First, the film of magnetic substance accomplishes the shielding effect when the direction of noises by the magnetic field generated by a current flowing through a wiring in the semiconductor chip is approximately parallel to the direction of magnetization by a magnetic film.

Figure 2:
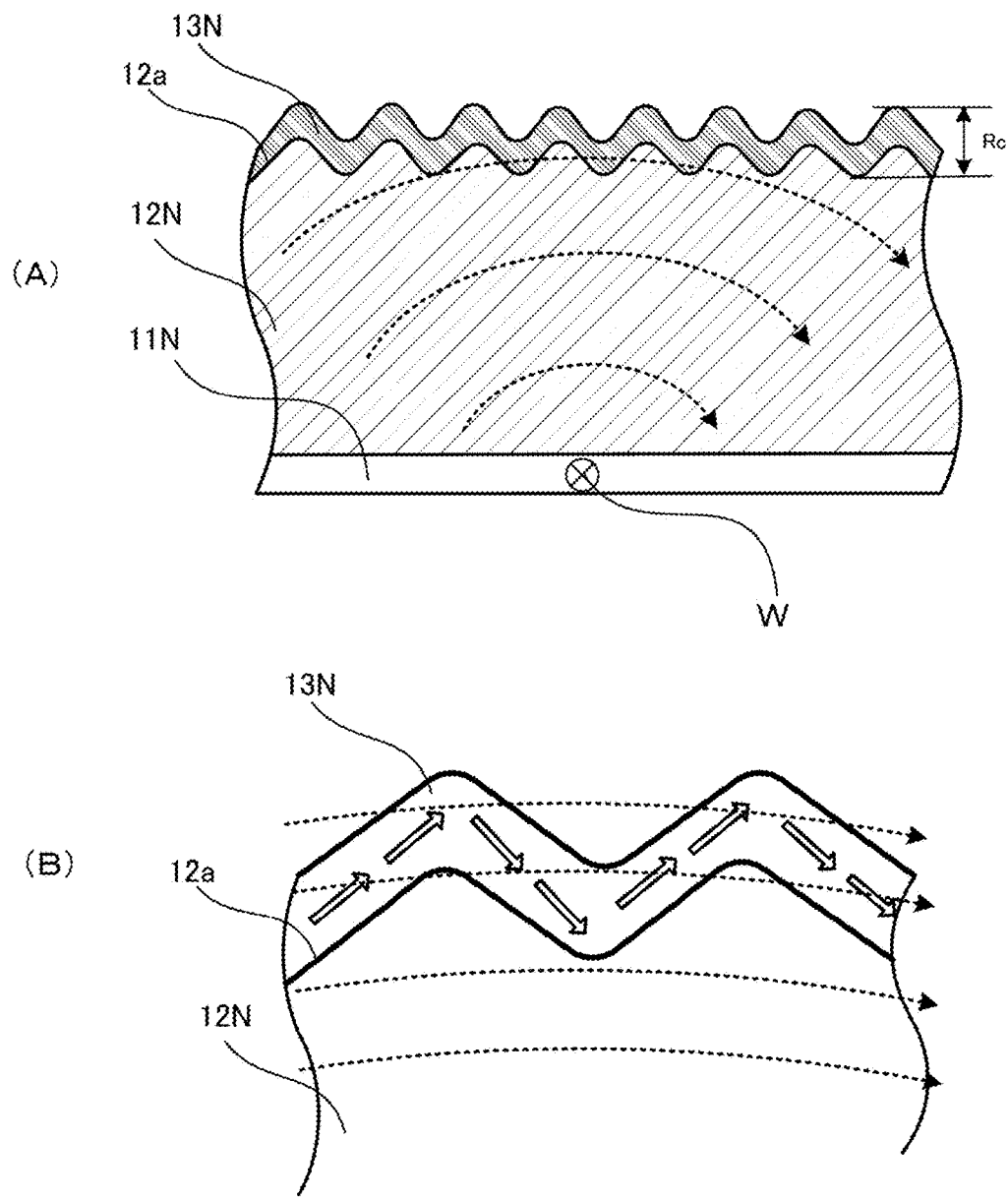
FIG. 2 is an explanatory diagram illustrating the principle in which an electromagnetic wave shielding characteristic is not obtainable by a swelling of the package surface of an electronic component.

However, microscopic concavities and convexities are present in the package 12 of the electronic component 10. Hereinafter, such concavities and convexities will be defined as a swelling. For example, as illustrated in FIG. 2A, when a synthetic resin is applied as a sealing material, there is a swelling having the Rc of 10 to several 10 μm in the surface of the package 12N. The direction of the magnetic field generated by the current which flows through a wiring W of the circuit in an element 11N becomes like a dotted arrow in the figure according to the right-handed screw rule.

In this case, when the top face 12a of the package 12N has a swelling, there are many locations where the magnetization direction of the electromagnetic wave shielding film 13N formed of the magnetic substance indicated by a white arrow in the figure differs from the direction of the magnetic field by the element 11 indicated by the dotted arrow in FIG. 2B. Hence, when the surface of the package 12 has a swelling, even if the electromagnetic wave shielding film 13 formed of a magnetic substance is formed thereon, a desired shielding characteristic cannot be obtained.

Figure 3:
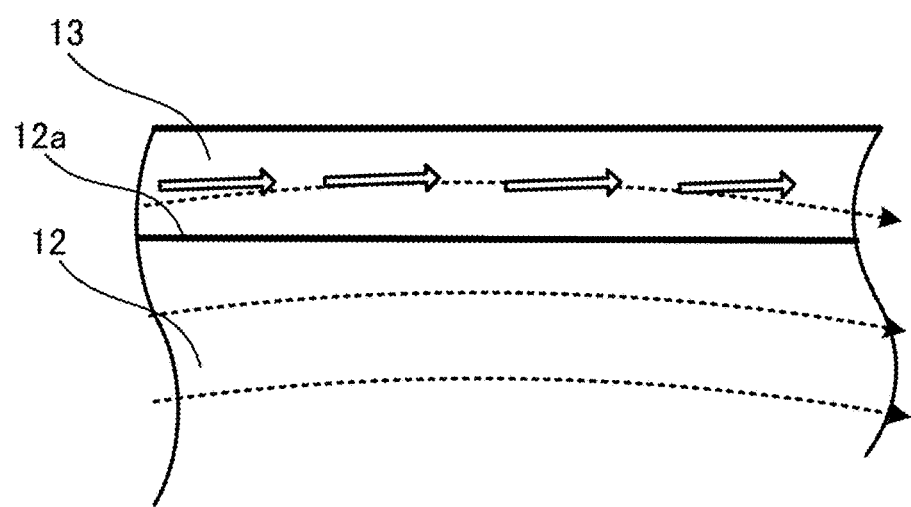
FIG. 3 is an explanatory diagram illustrating an example principle in which the electronic component according to the embodiment can obtain a shielding characteristic by an electromagnetic wave shielding film.

The electronic component 10 according to this embodiment reduces the swelling of the top face 12a of the package 12 as indicated in FIG. 3. Hereinafter, the reduce of the swelling will be referred to as flattening. Flattening allows the direction of the magnetic field generated by the element 11 and the magnetization direction of the magnetic substance of the electromagnetic wave shielding film 13 to be substantially parallel, thereby accomplishing an excellent shielding characteristic.

[Electronic Component Manufacturing Apparatus]

A manufacturing apparatus of an electronic component according to this embodiment as described above is a device divides a sealing body 12A into the multiple electronic components 10 and forms the electromagnetic wave shielding film 13 on each electronic component 10. The manufacturing apparatus of the electronic component includes a polishing apparatus 100, a dividing apparatus 200, and a film forming apparatus 300.

[Polishing Apparatus]

Figure 4:
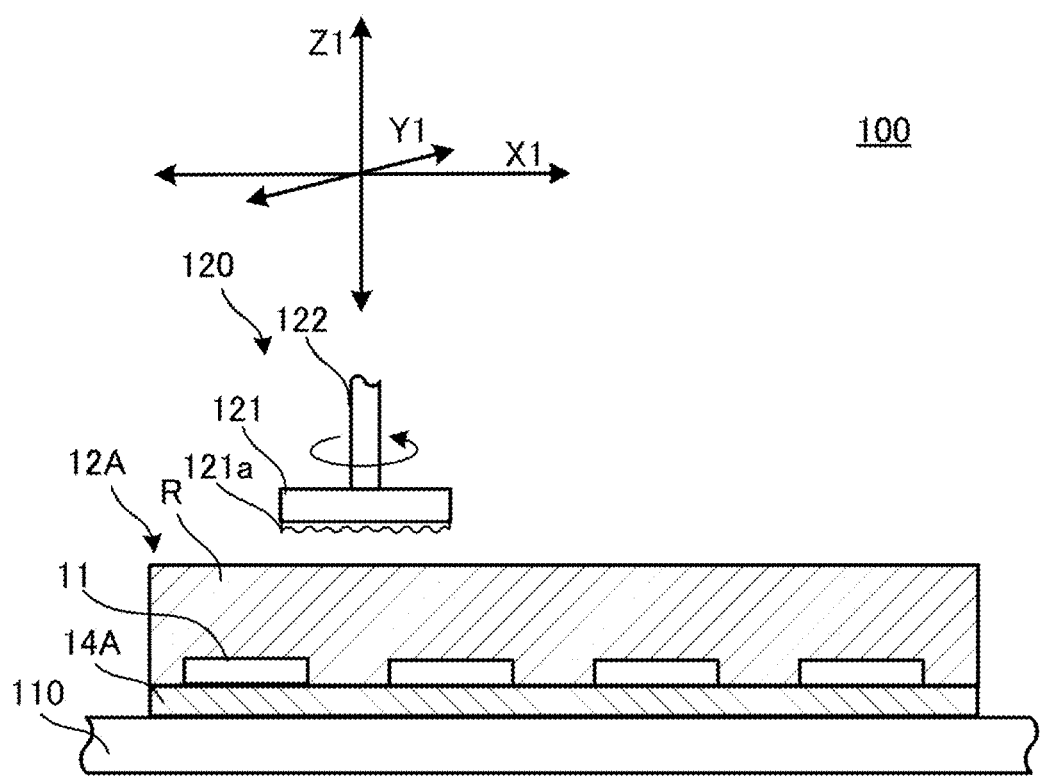
FIG. 4 is an explanatory diagram illustrating a polishing apparatus according to the embodiment.

As illustrated in FIG. 4, the polishing apparatus 100 polishes the top face of the sealing body 12A. The sealing body 12A is the member collectively sealing the multiple elements 11. As illustrated in FIG. 4 that is a cross-sectional view, the sealing body 12A is manufactured by a sealing apparatus which seals the multiple elements 11 mounted on an integrated substrate 14A in the previous process by a synthetic resin R so as to collectively cover the multiple elements 11. The sealing body 12A is formed in a substantially cuboid shape. In addition, the top face of the sealing body 12A becomes the top face 12a of the package 12 when divided.

An example applied polishing apparatus 100 is a CMP (Chemical Mechanical Polishing) apparatus. This polishing apparatus 100 includes a polishing table 110 and a polishing unit 120. The polishing table 110 is a plate having a leveled top surface. The sealing body 12A is placed on the top surface of the polishing table 110. Although it is not illustrated in the figure, but a holding unit, such as a groove, a hole, a protrusion, a jig, and a holder, to hold the sealing body 12A is provided on the top surface of the polishing table 110.

The polishing unit 120 is a member placed at the position that faces the polishing table 110 with a distance. The polishing unit 120 includes a polishing plate 121 and a shaft body 122. The polishing plate 121 is a circular disk plate placed facing with the polishing table 110 in parallel with the top surface thereof. A polishing pad 121a is stuck on a surface of the polishing plate 121 opposed to the polishing table 110. The polishing pad 121a is a circular sheet holding a slurry containing abrasive and becoming in contact with the sealing body 12A. Although it is not illustrated in the figure, the polishing apparatus 100 includes a supplying apparatus which supplies the slurry between the polishing pad 121a and the top face of the sealing body 12A.

The shaft body 122 is a bar member provided in the orthogonal direction to the plane of the polishing plate 121 at the center of the opposite surface of the polishing plate 121 to the polishing table 110. When the shaft body 122 is rotated by an unillustrated drive source like a motor, the polishing plate 121 rotates around the shaft body 122. In addition, the shaft body 122 moves, by an unillustrated driving mechanism, in a Z1 direction in which the bottom of the polishing plate 121 becomes in contact with or apart from the top face of the sealing body 12A on the polishing table 110, and an X1 direction and a Y1 direction parallel to the top face of the sealing body 12A.

Figure 5:
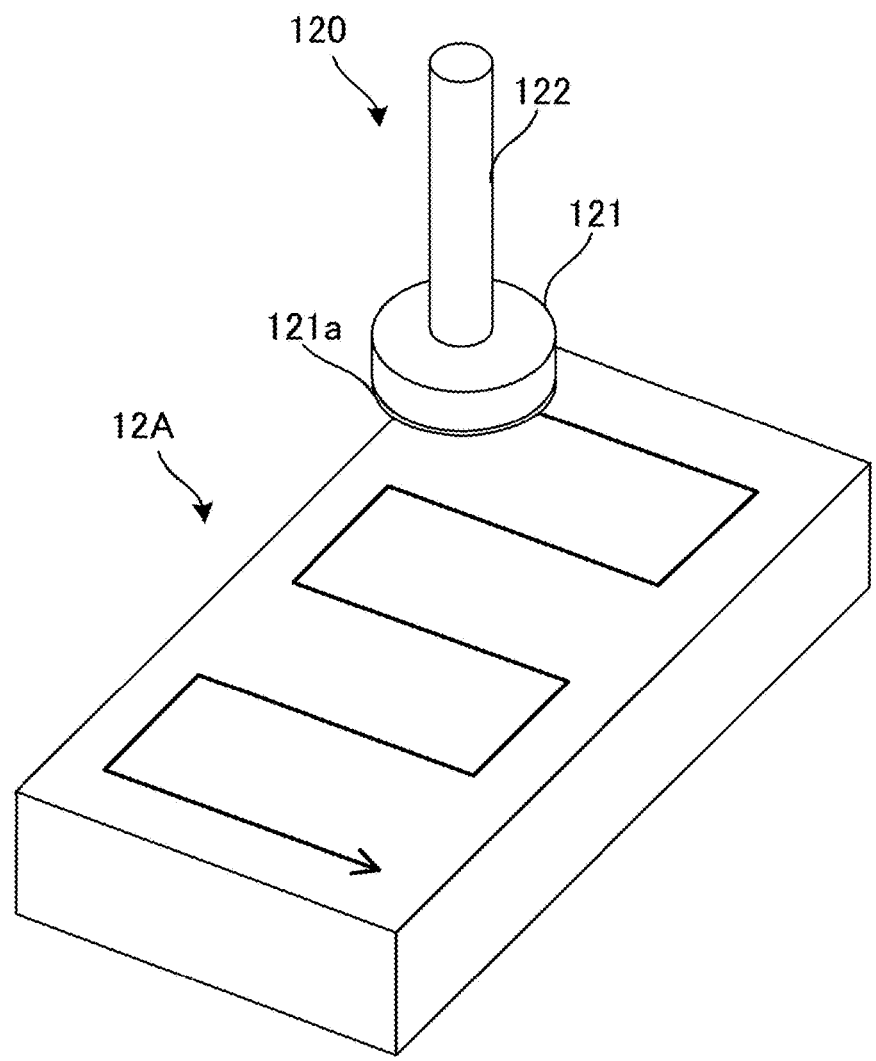
FIG. 5 is a perspective view illustrating a polishing operation by the polishing apparatus according to the embodiment.

More specifically, as illustrated in FIG. 5, the entire top face of the sealing body 12A can be polished by the polishing pad 121a in contact with the top face of the sealing body 12A, and moving in a zig-zag way relative to the horizontal direction.

[Dividing Apparatus]

Figure 6:
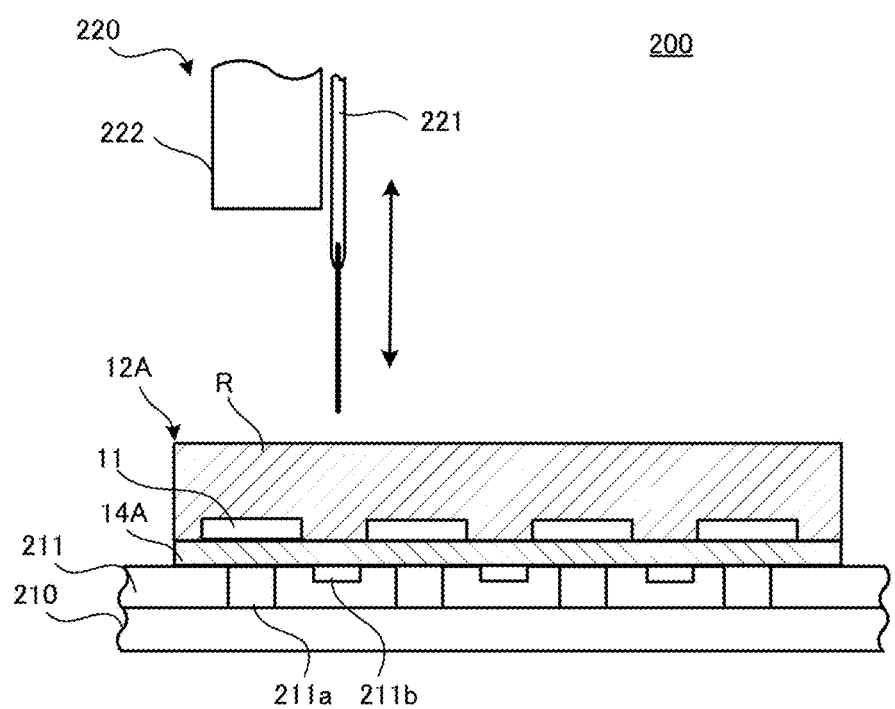
FIG. 6 is an explanatory diagram illustrating a dividing apparatus according to the embodiment.

As illustrated in FIG. 6, the dividing apparatus 200 cuts the sealing body 12A, thereby dividing the sealing body 12A into individual electronic components 10 having each element 11 sealed by the package 12 that is the sealing material. The dividing apparatus 200 has a support table 210 and a dicing unit 220. The supporting table 210 is a table on which the sealing body 12A is placed, and a holding unit 211 holding the sealing body 12A is provided on the top surface thereof. The holding unit 211 is a vacuum chuck which has a vacuum hole 211a connected to an unillustrated vacuum circuit. In addition, a groove 211b for retracting a blade 221 of the dicing unit 220 to be described later is formed in the holding unit 211. Still further, the supporting table 210 can change the cutting direction by turning around a horizontal θ-direction by an unillustrated drive mechanism.

The dicing unit 220 is installed at a position facing with a supporting table 210 with a distance. The dicing unit 220 includes a blade 221 and a frame 222. The blade 221 is a disk member around which cutting tooth is formed, and is installed so as to face the supporting table 210 with the center axis being in the horizontal direction. The frame 222 axially supports the center of the blade 221 so as to be turnable.

Figure 7:
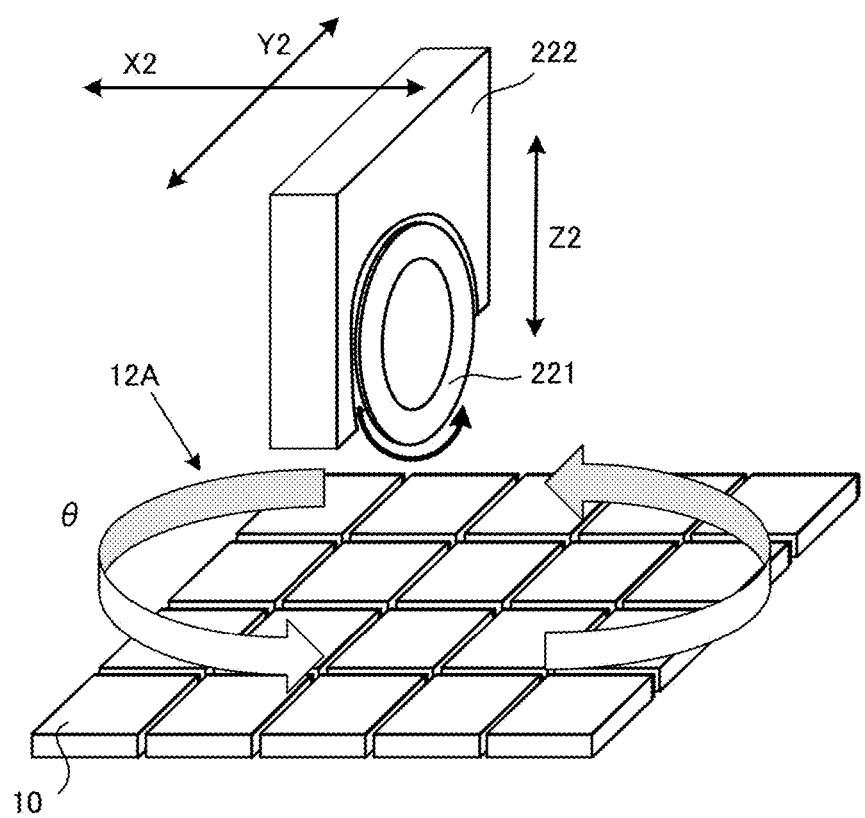
FIG. 7 is a perspective view illustrating the dividing apparatus according to the embodiment.

The blade 221 is turned by a drive source like an unillustrated motor built in the frame 222. In addition, as illustrated in FIG. 7, the frame 222 moves, by an unillustrated driving mechanism, in a Z2 direction in which the cutting tooth of the blade 221 contacts or becomes apart from the top face of the sealing body 12A on the supporting table 210, and also X2 direction and Y2 direction both parallel to the top face of the sealing body 12A.

More specifically, the frame 222 moves the blade 221 in the Y2 direction with the blade 221 being in contact with the sealing body 12A, thereby cutting the sealing body 12A in the linear direction. In addition, the blade 221 is moved in the X2 direction by a gap corresponding to the width of the electronic components 10, thereby cutting the electronic components 10 in the Y2 direction in sequence. Still further, the holding unit 211 is turned by 90 degrees in the θ direction, thereby cutting, like the above action, in sequence in the linear direction orthogonal to the cutting direction already made. Hence, the sealing body 12A is cut into a grid shape constituting rectangular or square grids, the electronic components 10 in a substantially rectangular cuboid shape or a substantially cube shape are divided into individual pieces. Although it is not illustrated in the figure, the dividing apparatus 200 is provided with a cleansing apparatus which performs cleansing on dusts, etc., produced by polishing and dicing.

[Film Forming Apparatus]

Figure 8:
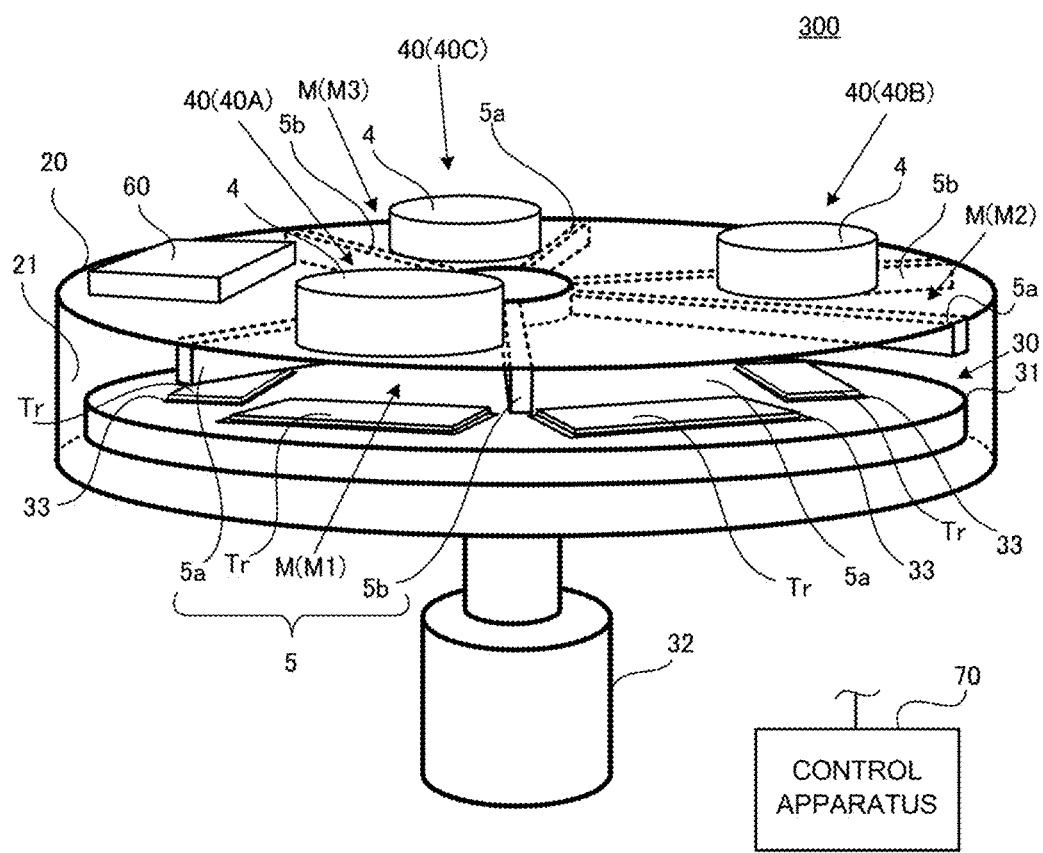
FIG. 8 is a transparent perspective view of a film forming apparatus according to the embodiment.

The film forming apparatus 300 forms the electromagnetic wave shielding film 13 on the outermost surface of the package 12 of the individual electronic component 10 by sputtering. As illustrated in FIG. 8, when a rotary table 31 rotates, the electronic component 10 on a tray Tr and held by the holding unit 33 moves along a circular trajectory, and when passing through the position facing a sputter source 4, the film forming apparatus 300 in this embodiment causes sputtered particles from a target 41 (see FIG. 10) to stick on the electronic component 10, thereby forming a film.

Figure 9:
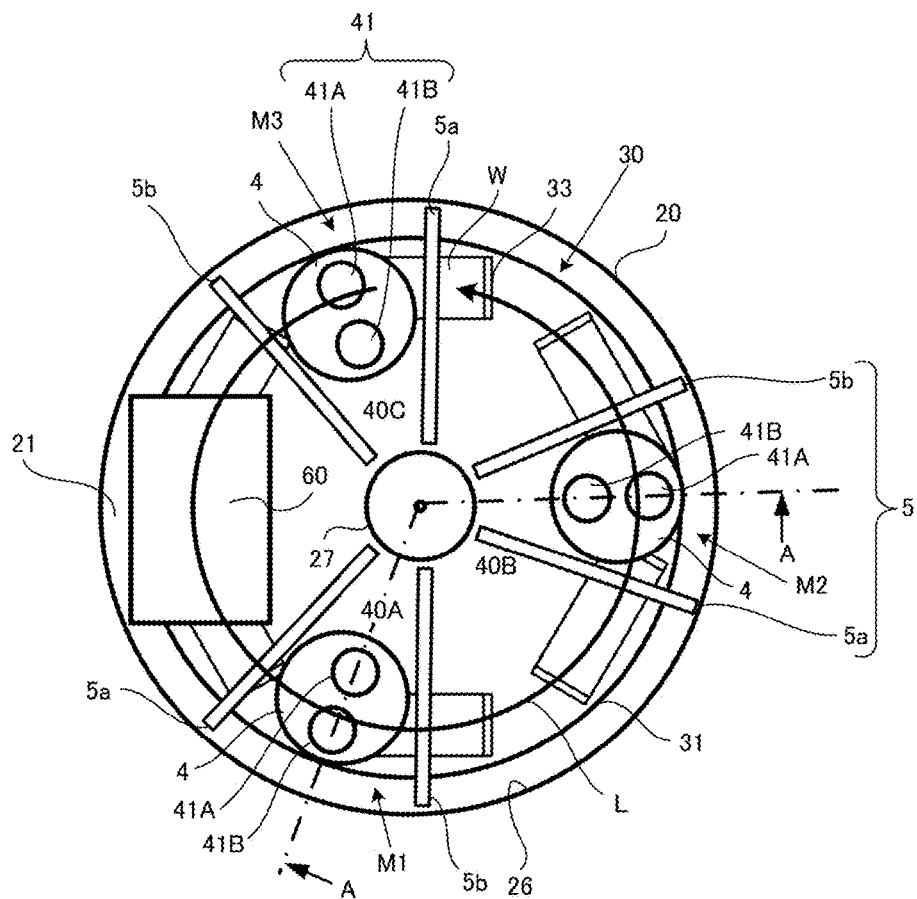
FIG. 9 is a transparent plan view of the film forming apparatus according to the embodiment.
Figure 10:
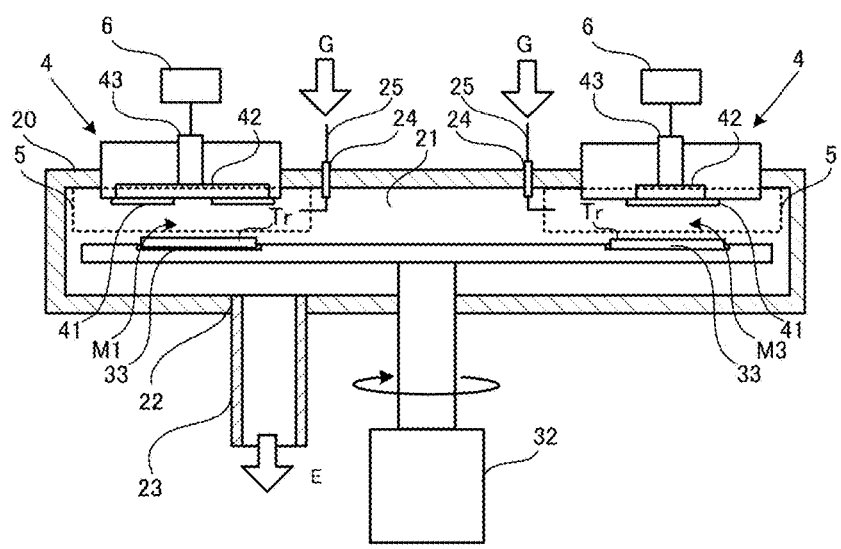
FIG. 10 is a vertical cross-sectional view taken along a line A-A in FIG. 9.

The film forming apparatus 300 includes, as illustrated in FIGS. 8 to 10, a chamber 20, a carrying unit 30, film formation processing units 40A to 40C, a load locking unit 60, and a control apparatus 70.

(Chamber)

As illustrated in FIG. 10, the chamber 20 is a container in which a sputtering gas G is introduced. The sputtering gas G is the gas for performing sputtering on the package 12 of the electronic component 10, causing produced ions, etc., to collide with the target 41 by plasma generated by an application of electric power. For example, an inactive gas like argon gas is applicable as the sputtering gas G.

The internal space of the chamber 20 forms a vacuum chamber 21. This vacuum chamber 21 has airtightness and is a space that can be vacuumed by depressurization. For example, as illustrated in FIGS. 8 and 10, the vacuum chamber 21 is an airtight space with a circular cylindrical shape.

The chamber 20 includes an exhaust port 22 and an inlet port 24. The exhaust port 22 is an outlet for ensuring a flow of gas between the exterior and the vacuum chamber 21, and for performing exhaust E. This exhaust port 22 is formed in, for example, the bottom of the chamber 20. The exhaust port 22 is connected with an exhausting unit 23. The exhausting unit 23 includes a pipe, unillustrated pump, valve, etc. The interior of the vacuum chamber 21 is depressurized by the exhausting process of this exhausting unit 23.

The inlet port 24 is an outlet for introducing the sputtering gas G around the target 41 in the vacuum chamber 21. This inlet port 24 is connected with a gas supply unit 25. The gas supply unit 25 is provided one by one for each target 41. In addition, the gas supply unit 25 includes unillustrated gas supplying source of the sputtering gas G, a pump, a valve, etc. The sputtering gas G is introduced in the vacuum chamber 21 via the inlet port 24 by this gas supply unit 25.

(Carrying Unit)

The carrying unit 30 is a device provided in the chamber 20 and circulates and carries the electronic components 10 along the circular trajectory. The above trajectory through which the electronic components 10 are moved by the carrying unit 30 is referred to as a carrying path L. The circulation and carrying indicates that the electronic components 10 are circulated and moved along the circular trajectory. This carrying unit 30 includes the rotary table 31, a motor 32, and the holding units 33.

Figure 11:
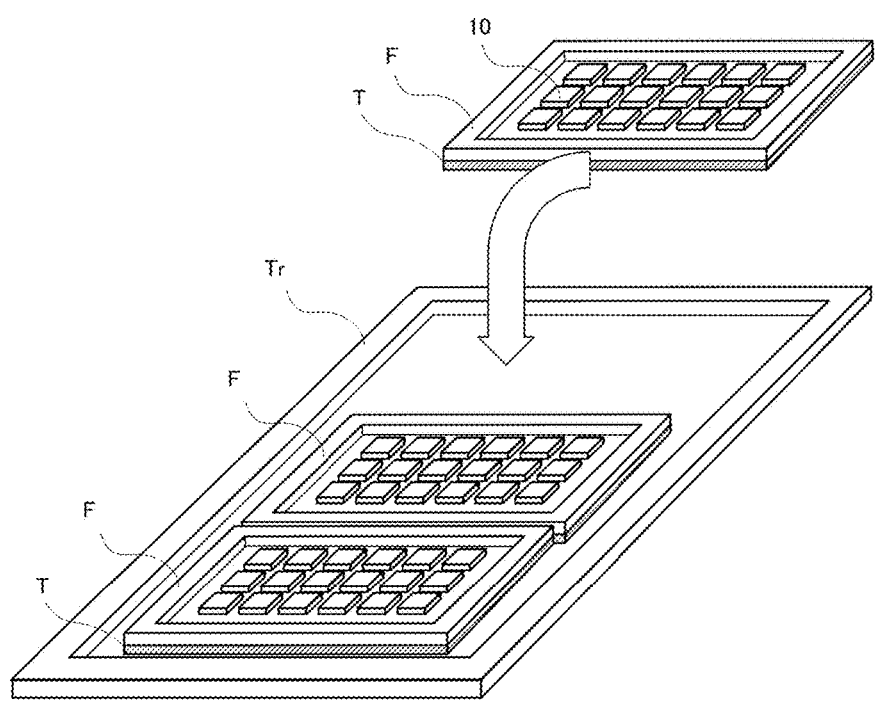
FIG. 11 is a perspective view illustrating a tray in which the electronic component is placed.

The rotary table 31 is a circular plate. The motor 32 applies drive force to the rotary table 31, and rotates the rotary table 31 around the center of the circle as an axis. The holding unit 33 is a component that holds the tray Tr carried by the carrying unit 30. That is, the electronic component 10 is held by the holding unit 33 via the tray Tr. As illustrated in FIG. 11, the multiple electronic components 10 are aligned and arranged on a tape T stretched in the horizontal direction in a frame F that is a substantially rectangular rack, at intervals in such a way that the film is formed on not only the top face 12a but also the side face 12b. The tape T has adhesiveness at only the top surface, and the electronic components 10 are stuck on such a top surface. The multiple frames F in which the electronic components 10 are arranged are prepared, and then placed on the tray Tr that is a substantially rectangular flat plate with bunched rims. However, the electronic component 10 may be held by the holding unit 33 alone. Thus, the electronic component 10 is positioned by the holding unit 33 on the rotary table 31.

The multiple holding units 33 are installed at equal interval. For example, each holding unit 33 is installed in the direction parallel to the tangent of the circle of the circumferential direction of the rotary table 31, and is installed at equal interval in the circumferential direction. More specifically, the holding unit 33 is a groove, a hole, a protrusion, a jig, or a holder, etc., which holds the tray Tr or the electronic component 10. An electrostatic chuck, a mechanical chuck, a sticking chuck, or the combination of these with a groove, a hole, a protrusion, a jig, a holder, a tray, etc. can form the holding unit 33. In this embodiment, since the six holding units 33 are installed, the six trays Tr or electronic components 10 are held on the rotary table 31 at the interval of 60 degrees. However, the number of the holding unit 33 may be one or a multiple number.

(Film Formation Processing Unit)

The film formation processing units 40A to 40C are each a processing unit which forms a film on the electronic component 10 carried by the carrying unit 30. Hereinafter, when the individual film formation processing units 40A to 40C are not distinguished, the description will be given as the film formation processing unit 40 (refer to FIG. 8). As illustrated in FIG. 10, the film formation processing unit 40 includes a sputter source 4, a separating unit 5, and a power supply unit 6.

(Sputter Source)

The sputter source 4 is a supply source of the film formation material which deposits the film formation material on the electronic component 10 by sputtering, and forms a film thereon. The sputter source 4 has the target 41, a backing plate 42, and an electrode 43. The target 41 is formed of the film formation material which is to be deposited on the electronic component 10 and to be a film, and is installed at the position facing with the carrying path L with a distance. As illustrated in FIG. 9, as for the target 41 of this embodiment, two targets 41A and 41B are arranged in the direction orthogonal to the carrying direction, i.e., in the radial direction of the rotation of the rotary table 31. Hereinafter, when the individual targets 41A and 41B are not distinguished, the description will be given as the target 41. The bottom side of the target 41 faces the electronic component 10 which is moved by the carrying unit 30 with a distance. As will be described later, Cu, Ni, Fe, etc., are applied as film formation material. However, various materials are applicable as long as those can form a film by sputtering. This target 41 is formed in, for example, cylindrical shape. However, the target 41 may be in other shapes, such as elongated cylindrical shape and a square pillar shape.

The backing plate 42 holds the target 41. The electrode 43 is a conductive member to apply electric power to the target 41 from the exterior of the chamber 20. The sputter source 4 may be provided with a magnet, a cooling mechanism, etc., as necessary.

As illustrated in FIG. 10, the multiple sputter sources 4 are installed on the lid of the chamber 20 in the circumferential direction. In the example case illustrated in FIGS. 8 to 10, the three sputter sources 4 are installed.

(Separating Unit)

The separating unit 5 separates film formation positions M1 to M3 where a film is formed on the electronic component 10 by the sputter source 4. Hereinafter, when the multiple film formation positions M1 to M3 are not distinguished, the description will be given as the film formation position M (refer to FIG. 8). As illustrated in FIG. 9, the separating unit 5 includes square-shaped wall plates 5a and 5b radially extended from the circumference center of the carrying path L, i.e., from the rotation center of the rotary table 31 of the carrying unit 30. The wall plates 5a and 5b are installed on the ceiling of the vacuum chamber 21 and in the positions holding the target 41 therebetween. The lower end of the separating unit 5 forms a space through which the electronic component 10 passes, and faces the rotary table. By providing the separating unit 5, it is possible to prevent the sputtering gas G and the film formation material from being dispersed in the vacuum chamber 21.

The film formation position M is a space separated by the separating unit 5 and includes the target 41 of the sputter source 4. More specifically, as illustrated in FIG. 9, the film formation position M is, as viewed in the planar direction, a sector-shaped space surrounded by the wall plates 5a and 5b of the separating unit 5, an internal surface 26 of the outer circumference wall of the chamber 20, and an external surface 27 of the internal circumference wall thereof. The range of the film formation position M in the horizontal direction is a region separated by the pair of wall plates 5a and 5b.

The film formation material is deposited as a film on the electronic component 10 which pass through the position facing the target 41 at the film formation position M. Although majority of film formation is performed in this film formation position M, but there is a leakage of the film formation material from the film formation position M at a region out of the film formation position M, and thus a slight film deposition occurs in such a region.

(Power Supply Unit)

The power supply unit 6 is a structure which applies electric power to the target 41. The plasma sputtering gas G is produced by applying power to the target 41 from this power supply unit 6, and the film formation material is deposited on the electronic component 10. In this embodiment, the power supply unit 6 is, for example, a DC power supply capable of applying a high voltage. In the case of an apparatus which performs high frequency sputtering, an RF power supply is also applicable. The rotary table 31 is in the same potential as that of the grounded chamber 20, and by applying a high voltage to the target 41, a potential difference is produced. This avoids a difficulty of connection with the power supply unit 6 since the movable rotary table 31 is set to be a negative potential.

The multiple film formation processing units 40 form a film formed of layers with multiple kinds of film formation materials by selectively depositing the film formation materials. In particular, in this embodiment, the sputter sources 4 corresponding to different kinds of film formation materials are installed, and a film formed of layers with multiple kinds of film formation material is formed by selectively depositing the film formation materials. The description that the sputter sources 4 corresponding to different kinds of film formation materials means a case in which the film formation materials of all film formation processing units 4 differ and a case in which although the multiple film formation processing units 40 have the common film formation material, but the others have a different film formation material. In this embodiment, the film formation material contains a magnetic substance. The description selectively depositing the film formation material kind by kind means that, while the film formation processing unit 40 of a kind of film formation material is performing film formation, the film formation processing unit 40 of the other kinds of film formation materials does not perform film formation. In addition, the film formation processing unit 40 that is performing film formation or the film formation position means the film formation processing unit 40 or the film formation position M in which power is applied to the target 41 of the film formation processing unit 40, and film formation is ready for the electronic component 10.

In this embodiment, three film formation processing units 40A to 40C are installed in the carrying direction of the carrying path L. The film formation positions M1 to M3 correspond to the three film formation processing units 40A to 40C. Among those film formation processing units 40A to 40C, the film formation processing unit 40A has the film formation material that is Cu. That is, the sputter source 4 of the film formation processing unit 40A has the targets 41A and 41B formed of Cu. Another film formation processing unit 40B has the film formation material that is Ni. That is, the sputter source 4 of the film formation processing unit 40B has the targets 41A and 41B formed of Ni. The other film formation processing unit 40C has the film formation material that is Fe. That is, the sputter source 4 of the film formation processing unit 40C has the targets 41A and 41B formed of Fe. In this embodiment, while any one film formation processing unit 40 is performing film formation, other film formation processing units 40 do not perform film formation.

(Load Locking Unit)

The load locking unit 60 carries, while maintaining the vacuum condition of the vacuum chamber 21, the unprocessed electronic component 10 or the tray Tr on which the electronic components 10 are placed into the vacuum chamber 21 from the exterior by an unillustrated carrying means, and carries out the processed electronic component 10 or the tray Tr to the exterior of the vacuum chamber 21. Since well-known structure is applicable to this load locking unit 60, the description will be omitted.

[Control Apparatus]

The control apparatus 70 controls each component of the film forming apparatus 300. For example, this control apparatus 70 may be accomplished by a dedicated electronic circuit, or a computer that is operated by predetermined program, and the like. That is, the control on the polishing apparatus 100, the control on the dividing apparatus 200, the control with respect to introduction and exhaust of the sputtering gas G to the vacuum chamber 21, a control on the power supply of the sputter source 4, and a control on the rotation of the rotary table 31, etc., have control details programmed, are executed by an arithmetic processing unit, such as a PLC or a CPU, and are compatible with various kinds and various number of film formation specifications.

Specific examples to be controlled are to drive the component of the polishing apparatus 100, to drive the component of the dividing apparatus 200, the initial exhausting pressure of the film forming apparatus 300, to select the sputter source 4, an applied power to the target 41, the flow volume, kind, introducing time and exhausting time of the sputtering gas G, and a film formation time.

Figure 12:
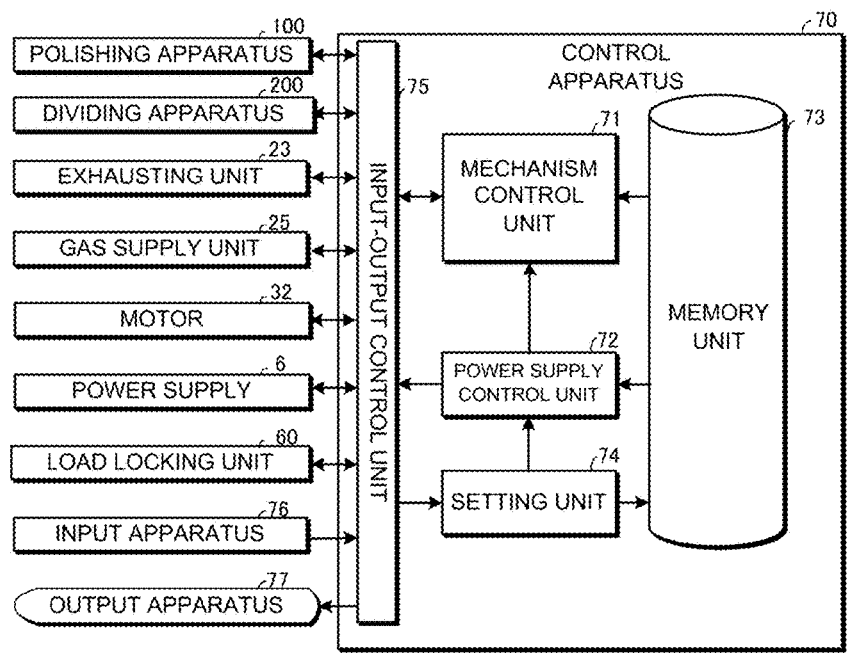
FIG. 12 is a block diagram illustrating a control apparatus according to the embodiment.

The structure of the control apparatus 70 for causing the component to operate as described above will be described with reference to FIG. 12 which is a virtual functional block diagram. That is, the control apparatus 70 includes a mechanism control unit 71, a power supply control unit 72, a memory unit 73, a setting unit 74, and an input-output control unit 75.

The mechanism control unit 71 controls the motor of the polishing apparatus 100, the drive mechanism thereof, the motor of the dividing apparatus 200, the drive mechanism thereof, the exhausting unit 23, the gas supply unit 25, the motor 32 of the carrying unit 30, the drive source, valve, switch, power supply, etc., of the load locking unit 60. The power supply control unit 72 controls the power supply unit 6.

The control apparatus 70 selectively control the film formation processing unit 40 in such a way that, while the film formation processing unit of a kind of film formation material is forming a film, the film formation processing units of the other kinds of film formation materials do not perform film formation. That is, the power control unit 72 does not apply the voltage to the targets 41 of the film formation processing units 40B and 40C, while applying the voltage to the target 41 of the film formation processing units 40A for film formation. In addition, the control apparatus 70 does not apply the voltage to the targets 41 of the film formation processing units 40A and 40C while applying the voltage to the targets 41 of the film formation processing unit 40B for film formation. Still further, the control apparatus 70 does not apply the voltage to the targets 41 of the film formation processing units 40A and 40B while applying the voltage to the target 41 of the film formation processing unit 40C for film formation.

The memory unit 73 stores necessary information for the control according to this embodiment. The setting unit 74 sets the information input from the exterior to the memory unit 73. The input-output control unit 75 is an interface which controls signal conversion and input and output thereof among the components to be controlled.

Still further, an input apparatus 76 and an output apparatus 77 are connected to the control apparatus 70. The input apparatus 76 is input means, such as a switch, a touch panel, a keyboard, or a mouse, that enables an operator to operate the film forming apparatus 300 via the control apparatus 70. For example, the selection of the sputter source 4 for film formation can be input via the input means.

The output apparatus 77 is output means, such as a display, an indicator, and a gauge, which enable the operator to visually check information for confirming the status of the apparatus. For example, the film formation position M corresponding to the sputter source 4 and where the film formation is being performed can be displayed on the output apparatus 77 in a manner distinguished from the other film formation positions M.

[Action]

Figure 13:
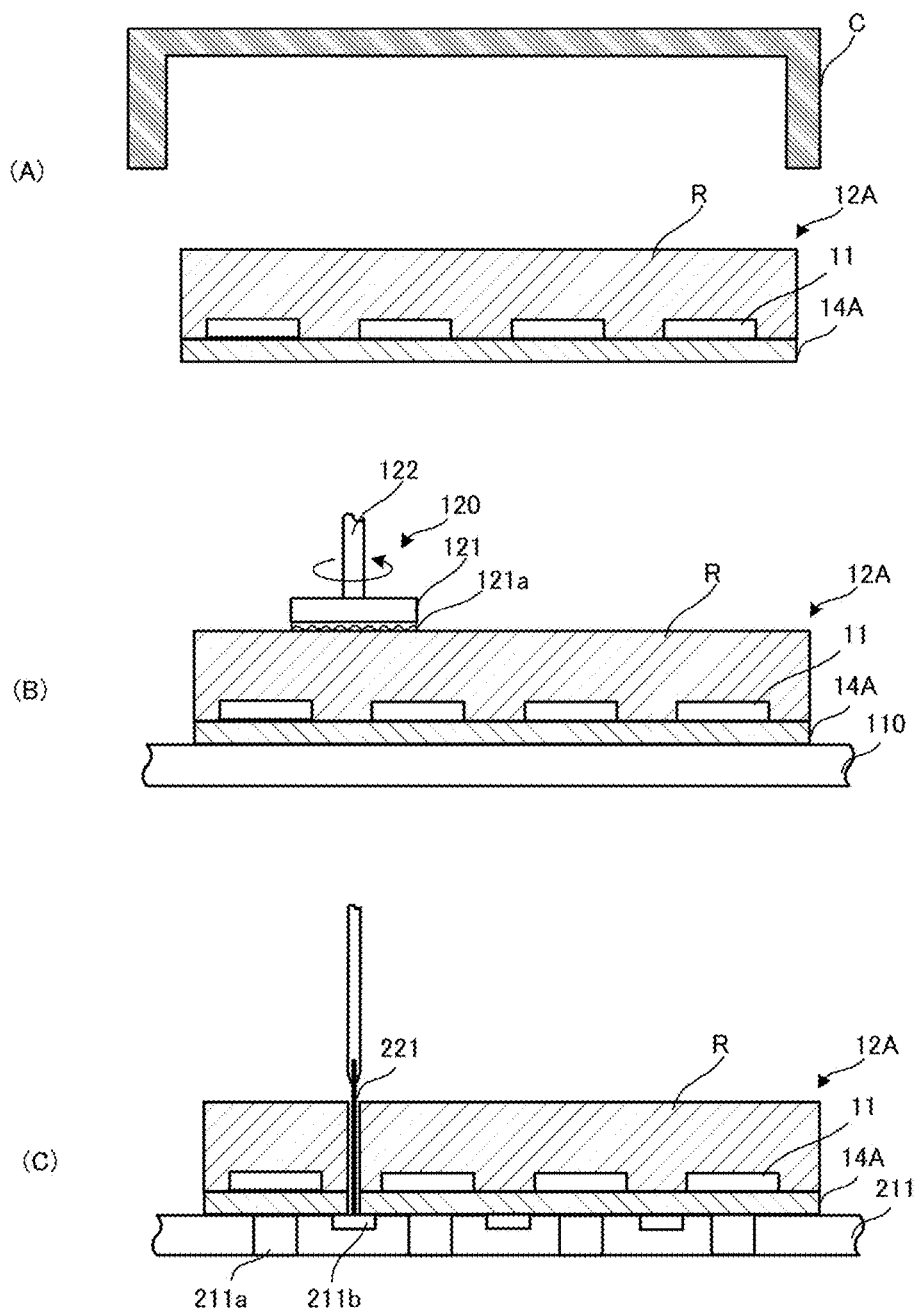
FIG. 13 is an explanatory diagram illustrating a manufacturing process of the electronic component according to the embodiment.
Figure 14:
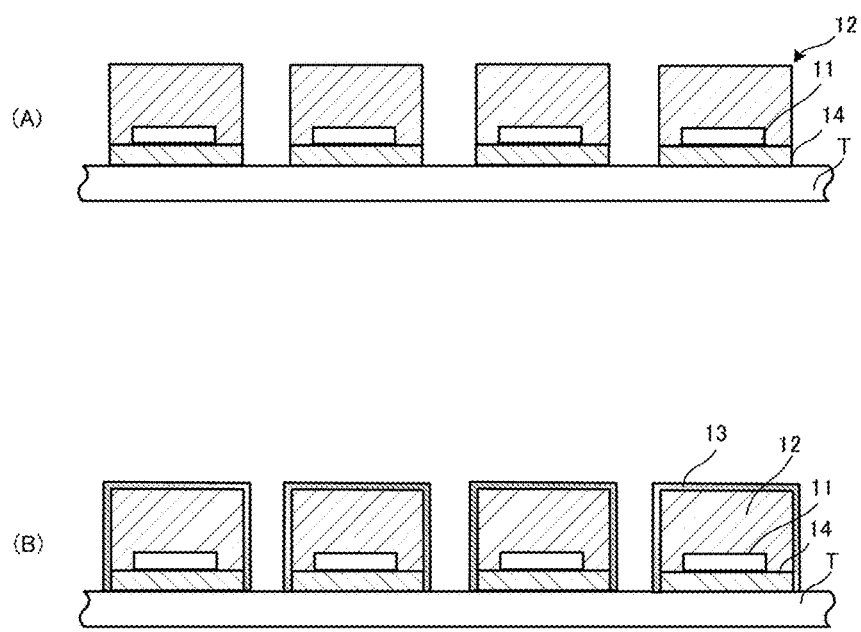
FIG. 14 is an explanatory diagram illustrating the manufacturing process of the electronic component according to the embodiment.

Actions according to the above embodiment will be described below with reference to FIGS. 13 to 14 in addition to the above description. Although it is not illustrated in the figure, respective carrying means, such as a conveyer or a robot arm, that carries the sealing body 12A and the electronic component 10 are installed between the polishing apparatus 100 and the dividing apparatus 200, and between the dividing apparatus 200 and the film forming apparatus 300. The sealing body 12A and the electronic component 10 are carried in, carried, and carried out between those apparatuses by the carrying means.

(Sealing Process)

According to the sealing apparatus in the pre-process, as illustrated in FIG. 13A, the sealing body 12A is manufactured by sealing the integrated substrate 14A so as to cover the multiple element 11 mounted thereon by the synthetic resin R that is a sealing material. More specifically, multiple circuit patterns are individually formed on a surface of the integrated substrate 14A formed of ceramics, glass, or an epoxy resin. Solder is supplied to the electrode pad formed on this circuit pattern, and the element 11 is placed thereon. This is put in a reflow furnace to melt the solder, and the element 11 is mounted on the integrated substrate 14A.

The sealing body 12A is formed by sealing the integrated substrate 14A so as to cover the element 11 mounted thereon by the synthetic resin R. The sealing is performed so as to collectively cover the multiple elements 11 by molding, coating, or sheet lamination. FIG. 13A illustrates an example case in which the sealing body 12A in a cuboid shape is formed by performing resin sealing by molding using a metal mold C.

(Polishing Process)

Next, the sealing body 12A formed as described above is placed on the polishing table 110, and held by the holding unit. Subsequently, as illustrated in FIG. 13B, the polishing plate 121 is rotated while a slurry is being supplied, the polishing pad 121a is caused to contact the top face of the sealing body 12A and scan in the horizontal direction, and the entire top face is polished. This scanning is performed by moving in a zig-zag pattern on the entire top face as illustrated in FIG. 5.

(Dividing Process)

As illustrated in FIG. 13C, the sealing body 12A having the polished top face is placed on the supporting table 210, and is subjected to a vacuum chuck by the holding unit 211. Next, the rotating blade 221 of the dicing unit 220 is caused to contact the sealing body 12A, and the sealing body 12A is cut along lines corresponding to the boundary of each element 11. That is, as illustrated in FIG. 7, the sealing body 12A is cut into the grid shape. Hence, the sealing body 12A is divided into the individual pieces of the electronic components 10. The individual piece of the electronic component 10 is cleansed by the cleansing apparatus so as to eliminate dusts etc., produced by polishing and dicing.

(Film Forming Process)

Still further, as illustrated in FIGS. 11 and 14A, the electronic components 10 are stuck side by side on the tape F of the frame F with an interval. The multiple frames F are placed on the tray Tr, and are sequentially carried into the chamber 20 by the carrying means of the load locking unit 60. The rotary table 31 moves the empty holding unit 33 to the carry-in location from the load locking unit 60 one by one. The holding unit 33 holds the individual tray Tr carried by the carrying means. Hence, the electronic components 10 subjected to film formation are all placed on the rotary table 31.

The film formation process to the electronic components 10 introduced in the film forming apparatus 300 as described above will be described with reference to FIGS. 8 to 10, and 14B. The following actions are examples to form the electromagnetic wave shielding film 13 on the surface of the electronic component 10 by the film formation processing units 40A to 40C. The electromagnetic wave shielding film 13 is formed by alternately laminating the Cu layer and the layer of the magnetic substance that is Ni—Fe.

The exhausting unit 23 exhausts and depressurizes the vacuum chamber 21 to obtain a vacuum condition. The gas supply unit 25 of the film formation processing unit 40A supplies the sputtering gas G around the target 41. The rotating table 31 is rotated and reaches a predetermined rotation speed. Hence, the electronic component 10 held by the holding unit 33 moves on the carrying path L along the circular trajectory, and passes through the position facing the sputter source 4.

Next, the power supply unit 6 applies power to the target 41 of only the film formation processing unit 40A. Hence, the plasma sputtering gas G is obtained. In the sputter source 4, the ions produced by plasma collide with the target 41, and the particles of film formation material are beaten out. Accordingly, the particles of the film formation material are deposited on the surface of the electronic component 10 that passes through the film formation position M1 of the film formation processing unit 40A every time the electronic component 10 passes through. In this case, the Cu layer is formed. At this time, although the electronic component 10 passes through the film formation positions M2 and M3 of the film formation processing units 40B and 40C, since no power is applied to the targets 41 of the film formation processing units 40B and 40C, the film formation process is not performed at those positions, and the electronic component 10 is not heated. In addition, the electronic component 10 is not heated in regions other than the film formation positions M1 to M3. Thus, in the regions where the electronic component 10 is not heated, the electronic component 10 dissipates heat.

When the film formation time by the film formation processing unit 40A elapses, the film formation processing unit 40A is deactivated. That is, application of the power to the target 41 by the power supply unit 6 is terminated. Next, the power supply unit 6 of the film formation processing unit 40B applies power to the target 41. Hence, the plasma sputtering gas G is obtained. In the sputter source 4, the ions produced by plasma collide with the target 41, and the particles of film formation material are beaten out. Accordingly, the particles of the film formation material are deposited on the surface of the electronic component 10 that passes through the film formation position M2 of the film formation processing unit 40B every time the electronic component 10 passes through. In this case, the Ni layer is formed. This layer becomes a part of the magnetic substance layer. At this time, although the electronic component 10 passes through the film formation position M1 of the film formation processing unit 40A, since no power is applied to the target 41 of the film formation processing unit 40A, the film formation process is not performed at the position, and the electronic component 10 is not heated. In addition, the electronic component 10 is not heated in regions other than the film formation positions M1 to M3. Thus, in the regions where the electronic component 10 is not heated, the electronic component 10 dissipates heat.

When the film formation time by the film formation processing unit 40B elapses, the film formation processing unit 40B is deactivated. That is, application of the power to the target 41 by the power supply unit 6 is terminated. Next, the power supply unit 6 of the film formation processing unit 40C applies power to the target 41. Hence, the plasma sputtering gas G is obtained. In the sputter source 4, the ions produced by plasma collide with the target 41, and the particles of film formation material are beaten out. Accordingly, the particles of the film formation material are deposited on the surface of the electronic component 10 that passes through the film formation position M3 of the film formation processing unit 40C every time the electronic component 10 passes through. In this case, the Fe layer is formed. This layer becomes the magnetic substance layer. At this time, although the electronic component 10 passes through the film formation position M1 of the film formation processing unit 40A, since no power is applied to the target 41 of the film formation processing unit 40A, the film formation process is not performed at the position, and the electronic component 10 is not heated. In addition, the electronic component 10 is not heated in regions other than the film formation positions M1 to M3. Thus, in the regions where the electronic component 10 is not heated, the electronic component 10 dissipates heat.

When the film formation time by the film formation processing unit 40C elapses, the film formation processing unit 40C is deactivated. That is, application of the power to the target 41 by the power supply unit 6 is terminated. Hence, by repeating the film formations by the film formation processing units 40B and 40C, the magnetic substance film in which a large number of Ni films and Fe films are laminated is formed. Subsequently, by performing the film formation by the film formation processing unit 40A again, the Cu film is formed. By further alternately forming the Cu layer and the magnetic substance layer of Ni and Fe, as illustrated in FIG. 14B, the electromagnetic wave shielding films 13 are formed on the top face of the package 12 of the electronic component 10 and the side thereof.

[Characteristic Test of Electromagnetic Wave Shielding Film of Magnetic Substance]

A test result for how the swelling of the top face 12a of the package 12 affects the shielding characteristic of the electromagnetic wave shielding film 13 of a magnetic substance will be described below. As for an object for film formation, a glass substrate ST simulating the top face 12a of the package 12 was applied. As for a substrate having a surface swelling, the substrate ST having Rc=15 μm were prepared, and as for a substrate having no surface swelling, the substrate ST having a polished surface and having Rc=0.001 μm were prepared.

Figure 15:
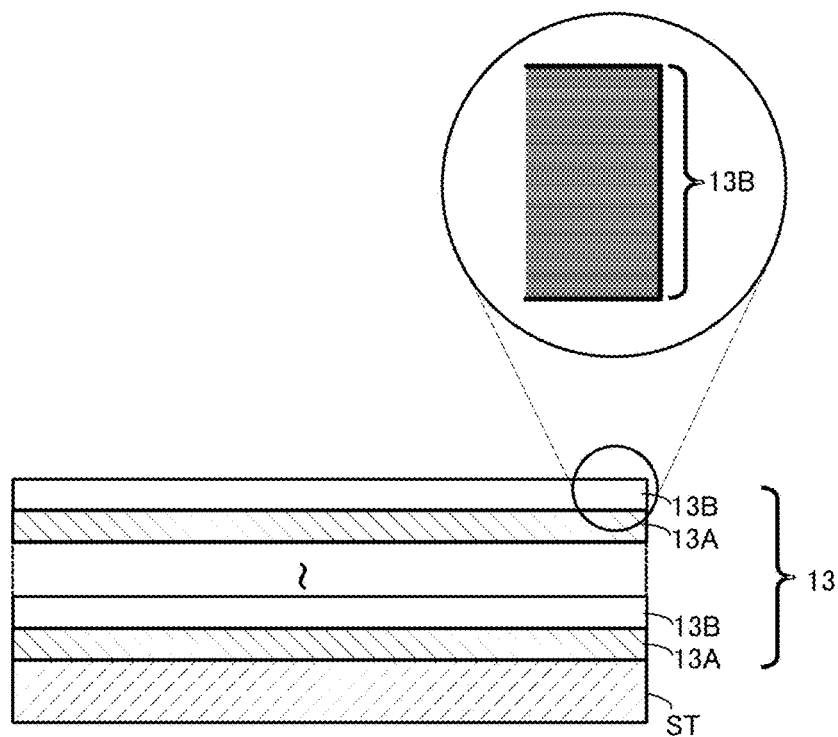
FIG. 15 is an exemplarily cross-sectional view illustrating an electromagnetic wave shielding film applied for a shielding characteristic test.

As illustrated in FIG. 15, a Cu film 13A of 50 nm and a magnetic substance film 13B of Ni—Fe were repeatedly laminated on the surface of each substrate by the above film forming apparatus, and an electromagnetic wave shielding film of 1 μm which contained a total of 20 layers was formed. Each magnetic substance film 13B was formed by repeatedly laminating 0.35 nm of the Ni film layer and 0.09 nm of the Fe film layer. The film formation condition of each layer was as indicated in Table 1.

formed on the top face 12a of the package 12 sealing the elements 11, the thickness of the electromagnetic wave shielding film 13 on the top face 12a of the package 12 is 0.5 to 9 μm, and the relationship between the average height Rc of the roughness curvature factor of the top face 12a of the package 12 and the thickness Te of the electromagnetic wave shielding film 13 is Rc≤2Te.

Hence, the swelling of the electromagnetic wave shielding film 13 on the top face 12a of the package 12 is reduced, the direction of the magnetic field generated by the current which flows through the wiring in the electronic component 10 and the direction of magnetization of the magnetic film become substantially in parallel with each other, and thus an excellent shielding effect is achieved. That is, when there is no surface swelling, 0.5 to 9 μm of the thickness Te can be considered for the electromagnetic wave shielding film 13 capable of obtaining the shielding effect. Hence, the shielding effect is accomplished when the top face 12a of the package 12 is flattened so as to satisfy Rc≤2Te.

More preferably, Rc is set to be equal to or smaller than 5 μm. In addition, the thickness Te may be 0.5 to 3 μm. The reduction of the thickness Te has an effect of suppressing a temperature rise of the electronic component 10 at the time of sputtering.

The electronic component manufacturing apparatus according to this embodiment includes the polishing apparatus 100 which polishes the top face of the sealing body 12A having the multiple elements 11 sealed by a sealing material, the dividing apparatus 200 which divides the sealing body 12A into the individual electronic component 10 having each element 11 sealed by the package 12 of the sealing material by dicing the sealing body 12A, and the film forming apparatus 300 which forms the electromagnetic

TABLE 1

| FILM FORMATION LAYER | FILM FORMATION MATERIAL | FILM FORMATION POSITION | TARGET MATERIAL | TARGET THICKNESS [nm] | FILM FORMATION RATE [nm/s] | TABLE ROTATING SPEED [rpm] | APPLIED POWER TARGET 41A [W] | APPLIED POWER TARGET 41B [W] | ALGON GAS FLOW VOLUME [accm] | FILM FORMATION TIME [s] |
|---|---|---|---|---|---|---|---|---|---|---|
| 1 | Cu | M1 | Cu | 50.00 | 1.46 | 7 | 2190 | 2857 | 100.0 | 34.3 |
| 2 | Ni—Fe | M3 | Fe | 50.00 | 0.09 | 60 | 246 | 321 | 120.0 | 114 |
|   |   | M2 | Ni |   | 0.35 |   | 860 | 1130 | 100.0 |   |
| ? | ? | ? | ? | ? | ? | ? | ? | ? | ? | ? |
| 19 | Cu | M1 | Cu | 50.00 | 1.46 | 7 | 2190 | 2857 | 100.0 | 34.3 |
| 20 | Ni—Fe | M3 | Fe | 50.00 | 0.09 | 60 | 246 | 321 | 120.0 | 114 |
|   |   | M2 | Ni |   | 0.35 |   | 860 | 1130 | 100.0 |   |

Figure 16:
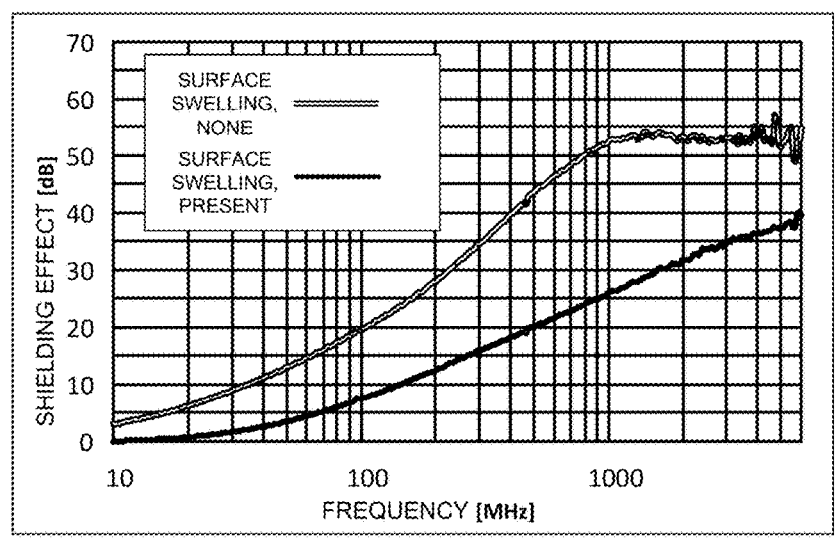
FIG. 16 is a graph illustrating the result of the shielding characteristic test.
Figure 17:
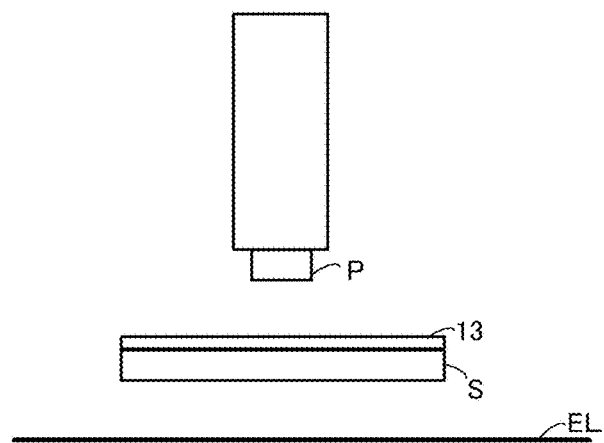
FIG. 17 is an explanatory diagram illustrating a testing apparatus for the shielding characteristic.

As for the substrate having no surface swelling and the substrate having a surface swelling, FIG. 16 illustrates a result of measuring the shielding effect [dB] for electromagnetic waves in 10 MHz to 6 GHz, i.e., 20×log$_{10}$, (field intensity when there was no shield/field intensity when there was a shield). As illustrated in FIG. 17, a measuring apparatus that includes a line EL that produces electromagnetic waves in a desired frequency by flowing a current, and a probe P that detects the field intensity was applied. That is, the shielding effect [dB] was obtained by measuring the field intensities when the substrate S was inserted between the line EL and the probe P, and when the substrate S was not inserted. As is clear from the result, within the entire frequency range from 10 MHz to 6 GHz, the shielding characteristic is excellent for the substrate having no surface swelling.

[Action and Effect]

According to this embodiment, the electronic component 10 includes the electromagnetic wave shielding film 13 wave shielding film 13 on the external surface of the package 12 of the individual electronic component 10 by sputtering.

Accordingly, by polishing the top face of the package 12 of the electronic component 10 using the polishing apparatus 100, the top face thereof is flattened, enabling the electromagnetic wave shielding film 13 to accomplish the shielding performance. Since the polishing can be performed before the sealing body 12A is divided by the dividing apparatus 200, the respective top faces of the large number of electronic components 10 can be easily flattened.

The film forming apparatus 300 includes the chamber 20 that is a container in which the sputtering gas G is introduced, the carrying unit 30 which is installed in the chamber 20 and which circulates and carries the electronic components 10 on the circular trajectory, and the multiple film formation processing units 40A to 40C each including the sputter source 4 that deposits the film formation material on the electronic components 10 being circulated and carried by the carrying unit 30 to form a film by sputtering, and also including the separating unit that separates the film formation position where the sputter source 4 forms the film on the electronic component 10.

When the electronic component 10 passes through the space below the film formation processing unit 40 that is forming a film, even if the temperature of the electronic component 10 increases by plasma heat, the heat can be dissipated while the electronic component 10 passes through the carrying path L below the film formation processing unit 40 that is not forming the film, or the carrying path L where no film formation processing unit 40 is present, and reaches again the space below the film formation processing unit 40 that is forming the film.

Hence, in comparison with a case in which the electronic component 10 is subjected to sputtering at a stationary location, without applying a cooling means, an excessive increase of the temperature of the electronic component 10 by plasma heat is suppressed, and thus a film in a micron level which is relatively thick can be formed. This is suitable for forming the electromagnetic wave shielding film 13 in a micron level on the package 12 of the semiconductor chip which is likely to be affected by heat. Such a temperature increase can be suppressed in not only a case in which the magnetic substance is applied as the material of the electromagnetic wave shielding film 13, but also other cases in which other materials than the magnetic substance are applied.

Still further, since it is unnecessary to install cooling means, the structure of the apparatus can be simplified, and power consumption required for cooling can be reduced. In addition, a labor work for a constant maintenance of cooling means can be eliminated.

The multiple film formation processing units 40 include the respective sputter sources 4 corresponding to different kinds of film formation materials, and are capable of forming a film including the layers of the multiple kinds of film formation materials by selectively depositing the single kind of the film formation material one by one.

In normal sputtering, when layers of multiple kinds of film formation materials are formed, heating of the electronic component 10 is likely to advance, but according to this embodiment, a temperature increase is suppressed. In particular, since the thin film of magnetic substance is formed, a time per a layer can be reduced, and thus a heating of the electronic component 10 is suppressed.

[Other Embodiments]

The present disclosure is not limited to the above embodiment, and also covers the following aspects.

(1) Instead of eliminating a swelling by the polishing of the polishing apparatus, the top face of the sealing body 12A or the package 12 may be flattened using a highly precise metal mold. In this case, although the metal mold is expensive, the condition Rc≤2Te or Rc of equal to or smaller than 5 μm may be satisfied by, for example, molding. This enables an elimination of the polishing process and simplification of the processes, thereby decreasing the costs of the entire apparatus. In addition, the package of the individually divided electronic component may be flattened by polishing. That is, the apparatus, method, and process for flattening are not limited to the above embodiment. For example, a polyimide varnish, etc., may be coated on the top face of the sealing body 12A or the package 12 to achieve flatness. A filler of $SiO_2$, etc., is filled in the sealing body 12A or the package 12. The top face of the sealing body 12A includes a part formed of the synthetic resin R and a part where the filler is exposed. Since the film to be formed by sputtering is affected by the base surface, the difference in the base surface affects the surface roughness. When flattening is accomplished by coating, since the top face of the sealing body 12A or the package 12 is covered by a uniform material, the effect from the base surface becomes uniform. That is, the flattening of the top face of the sealing body 12A or the package 12 also involves coating of other materials. In addition, the Rc of the top face of the sealing body 12A or the package 12 also involves the Rc of the surface to which coating is applied. As materials for coating, for example, materials with heatproof temperature of more than 260° C. or higher and a flattened surface is obtained after coating is preferable. The electronic components are heated up to around 260° C. at a reflow process, the material is required not to be melt or gasified at such temperature so as to prevent the electromagnetic wave shielding film to be removed.

(2) As for film formation materials, various materials which can form a film by sputtering are applicable. For example, in addition to Ni, and Fe, Cr, Co, etc., are applicable for magnetic substance. SUS may be applied as an adhesion layer of the base surface and a protective layer on the outermost surface. Still further, the material of the electromagnetic wave shielding film is not limited to the magnetic substance. Cu, Al, Ag, Ti, Nb, Pd, Pt, Zr, etc., are also applicable. Yet still further, as the adhesion layer of the base surface, SUS, Ni, Ti, V, Ta, etc., may be applied, or SUS, Au, etc., are applicable as the protective layer of the outermost surface. As described above, even in the case of the electromagnetic wave shielding film to which no magnetic substance like Cu is applied, the inventor of the present application verified that, through tests, when the surface roughness decreases and the surface is flattened, the shielding characteristic improves. More specifically, like the above embodiment, when a Cu film with a thickness of 5 μm was formed on a glass substrate which simulated the top face 12a of the package 12 and which had a surface swelling of Rc=15 μm, and a glass substrate having a surface swelling of Rc=0.001 μm, and the electromagnetic wave shielding effect was measured. Consequently, it was confirmed that the glass substrate with Rc=0.001 μm had a higher shielding effect. Although there is a possibility such that Cu, etc., result in a thick film thickness, by applying the film forming apparatus like the above embodiment, adding cooling means, or the like, a temperature increase is suppressed.

(3) According to the present disclosure, in the top face 12a of the package 12, the percentage of the part where the relationship between the average height Rc of the roughness curvature factor of the top face 12a and the thickness Te of the electromagnetic wave shielding film 13 becomes Rc≤2Te may not be 100%, and the percentage may be set that accomplishes at least the improvement of the electromagnetic wave shielding effect. In this case, it is preferable that the part where the relationship between the average height Rc of the roughness curvature factor of the top face 12a and the thickness Te of the electromagnetic wave shielding film 13 becomes Rc≤2Te is distributed uniformly, not concentrated at a location.

(4) As for the form of the package 12, any forms available presently or in future are applicable, such as BGA, LGA, SOP, and QFP. Although a terminal that electrically connects the electronic component 10 to the exterior may be a semi-circular terminal like BGA which is provided at a bottom, a flat terminal like LGA, a terminal provided at a side like SOP, and an elongated thin plate like QFP, any terminal available presently or in future are also applicable, and the location where the terminal is formed is not limited to any particular location. In addition, the number of elements 11 sealed in the electronic component 10 may be one or a multiple number.

(5) The number of targets at a film formation position is not limited to two. The single target may be provided, or equal to or greater than three targets may be provided. In addition, the number of film formation positions may be equal to or less than two or equal to or greater than four. A so-called reverse sputtering position where cleansing and surface processing by etching, ashing, etc., are performed may be provided.

(6) The number of the trays, that of electronic components which are simultaneously carried, and the number of holding units holding those may be at least one, and are not limited to the numbers exemplified in the above embodiment. That is, a configuration in which the single electronic component is circulated to repeatedly perform film formation, or a configuration in which equal to or greater than two electronic components are circulated to repeatedly perform film formation can be applied.

(7) Although cleansing and surface processing by etching and ashing, etc., may be performed in different chambers from the chamber with the film formation positions, but a so-called reverse sputtering position may be provided in a common chamber.

(8) In the above embodiment, the description was given of the example case in which the rotary table 31 rotates on a horizontal plane. However, the direction of the rotation surface of the carrying unit is not limited in any specific direction. For example, it may be a rotation surface that rotates on a vertical plane. In addition, the carrying means of the carrying unit is not limited to the rotary table. For example, a cylindrical member that includes the holding unit holding a work may be a rotary body that rotates around an axis.

(9) In the above embodiment, the film formation material of the single kind is selectively deposited kind by kind to forma film. However, the present disclosure is not limited to this case, and it is appropriate as long as a film that includes layers of multiple kinds of film formation materials by selectively depositing the film formation materials. Hence, equal to or greater than two kinds of film formation materials may be deposited simultaneously. For example, the electromagnetic wave shielding film is formed of an alloy containing Co, Zr, and Nb in some cases. In such a case, among the multiple film formation processing units, the film formation processing unit with the film formation material of Co, the film formation processing unit with the film formation material of Zr, and the film formation processing unit with the film formation material of Nb may be simultaneously selected to perform film formation.

In such a case, the film formation processing unit applied for film formation is selected or the installation of the separating unit that separates the film formation processing unit is set in such a way that, in the circular trajectory, the trajectory passing through the part other than the film formation position where the film formation is being performed becomes longer than the trajectory passing through the film formation position during the film formation.

That is, when film formation is performed by selecting the multiple film formation processing units with a kind of film formation material or the multiple film formation processing units with the multiple kinds of film formation materials, or by selecting the single film formation processing unit, the film formation processing unit applied for film formation is selected or the installation of the separating unit that separates the film formation processing unit is set in such a way that, in the circular trajectory, the trajectory passing through the part other than the film formation position where the film formation is being performed becomes longer than the trajectory passing through the film formation position during the film formation. The film forming apparatus may form a film by depositing a single kind of film formation material with a single film formation processing unit, or by depositing a single kind of film formation material with a multiple film formation processing units.

(10) Although the embodiment of the present disclosure and the modified forms thereof are described above, those embodiments and modified forms are merely presented as examples, and are not intended to limit the scope of the present disclosure. These novel embodiments as described above can be carried out in other various forms, and various omissions, replacements, and modifications can be made without departing from the scope of the present disclosure. Such embodiments and modified forms thereof are within the scope of the present disclosure, and also within the scope of the invention as recited in appended claims and equivalent range thereto.

What is claimed is:

1. A manufacturing apparatus of an electronic component comprising an electromagnetic wave shielding film formed on a top face of a package sealing an element,
    wherein a thickness Te of the electromagnetic wave shielding film is 0.5 to 9 μm,
    the manufacturing apparatus comprising:
    a polishing apparatus polishing a top face of a sealing body having a plurality of elements sealed by a sealing material so that a relationship between an average height Rc of a roughness curvature factor of the top face of the package and the thickness Te of the electromagnetic wave shielding film is Rc≤2Te;
    a dividing apparatus dividing the sealing body into the individual electronic component having each element sealed by a package of the sealing material by dicing the sealing body; and
    a film forming apparatus forming the electromagnetic wave shielding film on an external surface of the package of the individual electronic component by sputtering.

2. The electronic-component manufacturing apparatus according to claim 1,
    wherein the film forming apparatus comprises:
    a chamber that is a container in which a sputtering gas is introduced;
    a carrying unit which is installed in the chamber and which circulates and carries the electronic component on a circular trajectory; and
    a plurality of film formation processing units each comprising a sputter source that deposits a film formation material on the electronic component which is being circulated and carried by the carrying unit to form a film by sputtering, and also comprising a separating unit that separates a film formation position where the sputter source forms the film on the electronic component.

3. The electronic-component manufacturing apparatus according to claim 2, wherein the plurality of film formation processing units comprises the respective sputter sources corresponding to different kinds of film formation materials, and form a film comprising layers of the plural kinds of film formation materials by selectively depositing the single kind of the film formation material one by one.

* * * * *

UNITED STATES PATENT AND TRADEMARK OFFICE
CERTIFICATE OF CORRECTION

PATENT NO. : 10,244,670 B2
APPLICATION NO. : 15/730361
DATED : March 26, 2019
INVENTOR(S) : Akihiko Ito et al.

It is certified that error appears in the above-identified patent and that said Letters Patent is hereby corrected as shown below:

On the Title Page

In item (54) and in the Specification, Column 1, Lines 1-4 please delete the title "ELECTRONIC COMPONENT, ELECTRIC COMPONENT MANUFACTURING APPARATUS, AND ELECTRONIC COMPONENT MANUFACTURING METHOD", and replace with "ELECTRONIC COMPONENT, ELECTRONIC COMPONENT MANUFACTURING APPARATUS, AND ELECTRONIC COMPONENT MANUFACTURING METHOD"

Signed and Sealed this
Seventh Day of May, 2019

Andrei Iancu
*Director of the United States Patent and Trademark Office*